United States Patent
Xie et al.

(10) Patent No.: US 8,883,623 B2
(45) Date of Patent: Nov. 11, 2014

(54) FACILITATING GATE HEIGHT UNIFORMITY AND INTER-LAYER DIELECTRIC PROTECTION

(71) Applicants: GLOBALFOUNDRIES, Inc., Grand Cayman (KY); International Business Machines Corporation, Armonk, NY (US)

(72) Inventors: Ruilong Xie, Niskayuna, NY (US); Xiuyu Cai, Niskayuna, NY (US); Pranatharthiharan Balasubramanian, Watervliet, NY (US); Shom Ponoth, Gaithersburg, MD (US)

(73) Assignees: GLOBALFOUNDRIES Inc., Grand Cayman (KY); International Business Machines Corporation, Armonk, NY (US)

( * ) Notice: Subject to any disclaimer, the term of this patent is extended or adjusted under 35 U.S.C. 154(b) by 100 days.

(21) Appl. No.: 13/654,717

(22) Filed: Oct. 18, 2012

(65) Prior Publication Data
US 2014/0110794 A1    Apr. 24, 2014

(51) Int. Cl.
*H01L 21/3205* (2006.01)
*H01L 21/4763* (2006.01)

(52) U.S. Cl.
USPC .... 438/587; 438/595; 257/410; 257/E21.453; 257/E21.444

(58) Field of Classification Search
USPC .................................................. 257/E21.453
See application file for complete search history.

(56) References Cited

U.S. PATENT DOCUMENTS

| | | | |
|---|---|---|---|
| 6,566,190 B2 | 5/2003 | Lee et al. | |
| 7,122,849 B2 | 10/2006 | Doris et al. | |
| 7,138,323 B2 | 11/2006 | Kavalieros et al. | |
| 7,217,611 B2 | 5/2007 | Kavalieros et al. | |
| 7,718,479 B2 | 5/2010 | Kavalieros et al. | |
| 8,084,346 B1 | 12/2011 | Guo et al. | |
| 8,119,508 B2 | 2/2012 | Kavalieros et al. | |
| 8,232,148 B2 | 7/2012 | Li et al. | |
| 2009/0039433 A1* | 2/2009 | Yang et al. | 257/365 |
| 2010/0093165 A1* | 4/2010 | Bae et al. | 438/587 |
| 2011/0241118 A1 | 10/2011 | Ng et al. | |
| 2012/0052666 A1* | 3/2012 | Choi | 438/585 |
| 2012/0223394 A1 | 9/2012 | Toh et al. | |

* cited by examiner

*Primary Examiner* — Wensing Kuo
*Assistant Examiner* — Shaka White
(74) *Attorney, Agent, or Firm* — Kevin P. Radigan, Esq.; Heslin Rothenberg Farley & Mesiti P.C.

(57) ABSTRACT

Methods of facilitating replacement gate processing and semiconductor devices formed from the methods are provided. The methods include, for instance, providing a plurality of sacrificial gate electrodes with sidewall spacers, the sacrificial gate electrodes with sidewall spacers being separated by, at least in part, a first dielectric material, wherein the first dielectric material is recessed below upper surfaces of the sacrificial gate electrodes, and the upper surfaces of the sacrificial gate electrodes are exposed and coplanar; conformally depositing a protective film over the sacrificial gate electrodes, the sidewall spacers, and the first dielectric material; providing a second dielectric material over the protective film, and planarizing the second dielectric material, stopping on and exposing the protective film over the sacrificial gate electrodes; and opening the protective film over the sacrificial gate electrodes to facilitate performing a replacement gate process.

18 Claims, 6 Drawing Sheets

FACILITATING GATE HEIGHT UNIFORMITY AND INTER-LAYER DIELECTRIC PROTECTION

FIELD OF THE INVENTION

The present invention relates to semiconductor devices and methods of fabricating semiconductor devices, and more particularly, to methods of facilitating gate height uniformity and inter-layer dielectric protection in semiconductor devices fabricated, in part, using replacement metal gate processing.

BACKGROUND OF THE INVENTION

Gate-last, High-k Metal Gate (HKMG), also called replacement gate or replacement metal gate, techniques have been developed to address problems attendant upon substituting metal gate electrodes for, for example, polysilicon gate electrodes. In such a process, the polysilicon gate electrodes, also referred to as sacrificial gate electrodes or dummy gate electrodes in such a process, are replaced with metal gate material. The sacrificial gate electrode holds the position for the subsequent metal gate electrode to be formed. For example, an amorphous silicon (a-Si) or polysilicon gate may be used during initial processing until a high-temperature annealing to activate source/drain implants has been completed. Subsequently, the a-Si or polysilicon may be removed and replaced with a metal gate.

Replacement gates are being employed, especially in 32 nm, 28 nm, and 22 nm technology nodes. However, as technology nodes continue to decrease, there are challenges in using replacement gate technology. In particular, conventional processing can result in variation in the height of the resultant replacement metal gates. Further, as the gate pitch scales down, the inter-layer dielectric (ILD) gap fill becomes challenging. Flowable dielectric material (e.g., flowable oxide) is able to resolve this gap fill issue. However, the quality of flowable dielectric is typically poor, and the flowable dielectric may be vulnerable to subsequent wet/dry etch processing (such as an HF pre-clean before high-k deposition). Significant dielectric loss can occur if subsequent wet/dry etch processing is excessive.

Accordingly, a need exists for enhanced processing and structures to facilitate gate height uniformity in a replacement gate process, while providing better protection of the inter-layer dielectric.

BRIEF SUMMARY

The shortcomings of the prior art are overcome and additional advantages are provided through the provision, in one aspect, of a method which includes, for instance: providing a plurality of sacrificial gate electrodes with sidewall spacers, the sacrificial gate electrodes with sidewall spacers being separated by, at least in part, a first dielectric material, wherein the first dielectric material is recessed below upper surfaces of the sacrificial gate electrodes, and the upper surfaces of the sacrificial gate electrodes are exposed and coplanar; depositing a protective film over the sacrificial gate electrodes, the sidewall spacers, and the first dielectric material; providing a second dielectric material over the protective film, and planarizing the second dielectric material stopping on and exposing the protective film over the plurality of sacrificial gate electrodes; and opening the protective film over the sacrificial gate electrodes to facilitate performing a replacement gate process.

In a further aspect, a semiconductor device is provided which includes at least one semiconductor layer, multiple replacement gates, and a protective film. The at least one semiconductor layer includes an active region of the semiconductor device, and the multiple replacement gates are disposed over the active region of the device. The replacement gates include sidewall spacers, and are separated by a dielectric material. The protective film is disposed over the dielectric material, and upper surfaces of the replacements gates are coplanar. The dielectric material and the protective film disposed over the dielectric material are recessed below the coplanar upper surfaces of the replacement gates.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1A:
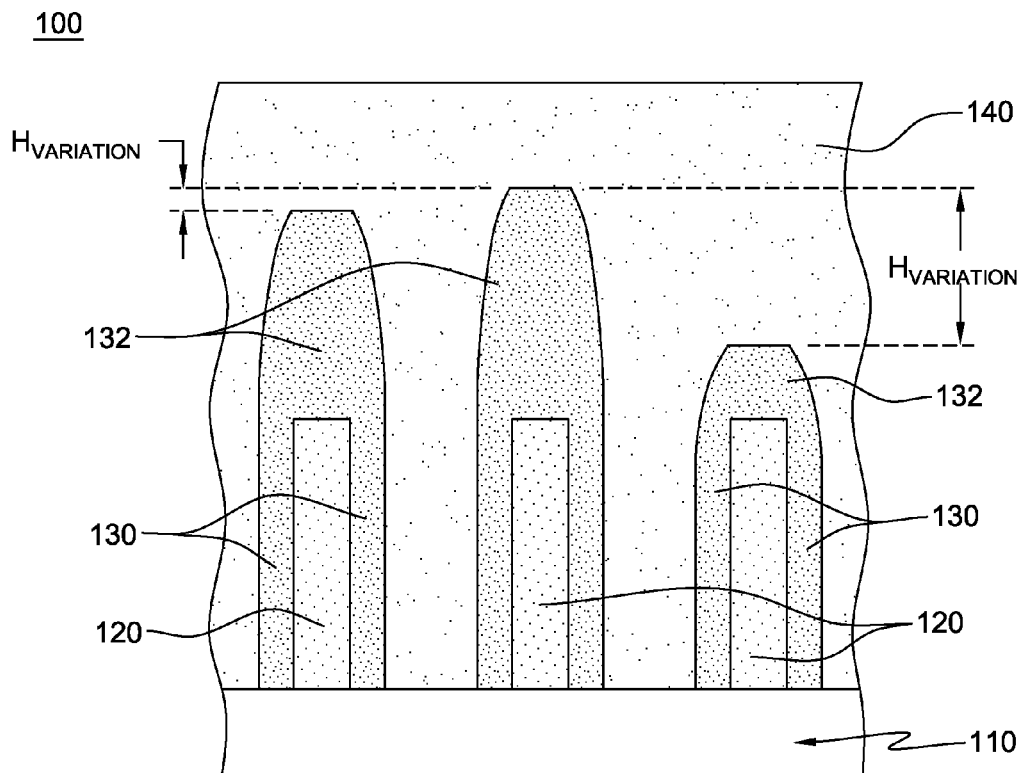
FIGS. 1A-1L depict illustrative processes for forming a device which includes a plurality of replacement gates with uniform height and inter-layer dielectric protection, in accordance with one or more aspects of the present invention.

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying inventive concepts will be apparent to those skilled in the art from this disclosure.

In advanced sub-32 nanometer (nm) technologies, replacement gate (RMG) processing is often employed to provide metal gate electrodes. In an RMG process, sacrificial gate electrodes, such as amorphous silicon (a-Si) or polysilicon gate electrodes, initially hold the positions for the subsequent metal gate electrodes to be formed. For example, an a-Si or polysilicon gate may be used during initial processing until high-temperature annealing to activate source/drain implants has been completed. Subsequently, the sacrificial gate electrodes may be removed and replaced with replacement metal gates. As technology nodes continue to decrease, there are two significant challenges for RMG processing.

First, a lack of planarity of the resultant metal gates can be an issue. For example, using RMG technology, metal gate height variations across the wafer may be, for example, as much as 50 nanometers. This lack of planarity or uniformity arises, at least in part, in conventional RMG processing from variations in the size of the hard masks over the sacrificial gate electrodes. As explained further below, the hard masks may comprise (in one example) silicon nitride, and be formed along with the sidewall spacers provided on the sidewalls of the sacrificial gate electrodes. Due to, at least in part, one or more etchings that may be employed, hard mask variations can occur. Additionally, n-p transition bumps may result from dual-epitaxial flow processing. Other RMG processes can result in, for example, further hard mask variations between different devices, such as between different NFET and PFET devices, as well as between different types of components, such as static random access memory (SRAM) and nominal devices.

A second challenge with conventional RMG processing is inter-layer dielectric (ILD) loss, which may occur with high-k, pre-cleaning of gate openings after removal of the sacrificial gate electrodes. Current RMG processing employs, for example, a high-density plasma (HDP) oxide over the ILD layer to reduce the ILD oxide loss, but the structure is still sensitive to the amount of dilute hydrofluoric (DHF) solution used in the high-k, pre-clean process, thereby restricting or limiting the high-k pre-cleaning window. Increasing the high-k, pre-clean process window would be very attractive for the RMG process, and would provide many benefits, such as making it easier to form tri-gates, and integrating easier with a thick oxide device, providing better electrostatic integrity/short channel control by box recess, etc.

As explained further below, the methods (and resultant semiconductor devices) disclosed herein address these challenges of existing RMG processes, and thereby enhance the use of replacement gates in 32 nm, 28 nm, 22 nm, and below, technology nodes.

Generally stated, disclosed herein, in one aspect, is a method which includes: providing a plurality of sacrificial gate electrodes with sidewall spacers, the sacrificial electrodes with sidewall spacers being separated by, at least in part, a first dielectric material (such as a field oxide), wherein the first dielectric material is recessed below upper surface of the sacrificial gate electrodes, and the upper surfaces of the sacrificial gate electrodes are exposed and coplanar; conformally depositing a protective film (for example, with a thickness of 10 nanometers or less) over the sacrificial gate electrodes, the sidewall spacers, and the first dielectric material; providing a second dielectric material over the protective film, and planarizing the second dielectric material, stopping on and exposing the protective film over the sacrificial gate electrodes; and opening the protective film over the sacrificial gate electrodes to facilitate performing a replacement gate process. The replacement gate process employed, as well as the pre-cleaning, may be any conventional replacement gate process and pre-clean process.

Advantageously, the protective film is a material different from the first dielectric material, and may (for instance) comprise SiN, $SiCN_2$, $Al_2O_3$, $SiCBN_2$, or $Hf_2O$. Also, the second dielectric material may be a higher quality dielectric material than the first dielectric material. In enhanced processing, planarizing the second dielectric material may include planarizing an exposed surface of the second dielectric material to be substantially coplanar with and expose the protective film over the sacrificial gate electrodes. After removal of the sacrificial gate electrodes through the openings in the protective film, the second dielectric material and the protective film over the first dielectric material protect the first dielectric material during the pre-cleaning of the gate openings. Note that the plurality of sacrificial gate electrodes, and thus, the resultant replacement gates, may be (for instance) disposed over an active region of the semiconductor device, such as over a planar active region or a fin-type active region. In one example, the sacrificial gate electrodes are employed as part of an RMG process for formation of gates of transistors being defined within the semiconductor device. Resultant semiconductor devices are also described and claimed herein.

Reference is made below to the drawings, which are not drawn to scale for ease of understanding, wherein the same reference numbers used throughout different figures designate the same or similar components.

FIG. 1A illustrates, by way of example only, one embodiment of an intermediate structure, generally denoted 100, obtained during fabrication of a semiconductor device employing, in part, replacement metal gate (RMG) processing. As illustrated, intermediate structure 100 includes an active region 110 of the semiconductor device. As one example, active region 110 may comprise a semiconductor material with respective source and drain regions of multiple transistors formed therein to be gated by the replacement gates ultimately formed, in accordance with the processing described herein with reference to FIGS. 1A-1L.

Continuing with FIG. 1A, the intermediate structure further includes a plurality of sacrificial gate electrodes 120 with sidewall spacers 130, and a hard mask 132 protecting the sacrificial gate electrodes. A first dielectric material 140, such as a field oxide, fills the spaces between the adjacent gate electrodes and sidewall spacers. As one detailed example, the active region 110 may comprise a planar-type active region or a fin-type active region, the sacrificial gate electrodes 120 may comprise a-Si or polysilicon, the sidewall spacers 130 and hard mask 132 may comprise silicon nitride, and first dielectric material 140 may comprise a field oxide of relatively lower quality within the spectrum of available oxides (such as flowable oxide).

Note with reference to FIG. 1A, the height variation ($H_{VARIATION}$) between the upper surfaces of the hard masks 132 protecting the sacrificial gate electrodes 120. With conventional RMG processing, this height variation, which may result in part from prior etching of the sidewall spacers, is translated into a height variation in the resultant replacement gates. As noted, $H_{VARIATION}$ may be, for instance, as much as 50 nanometers.

Figure 1B:
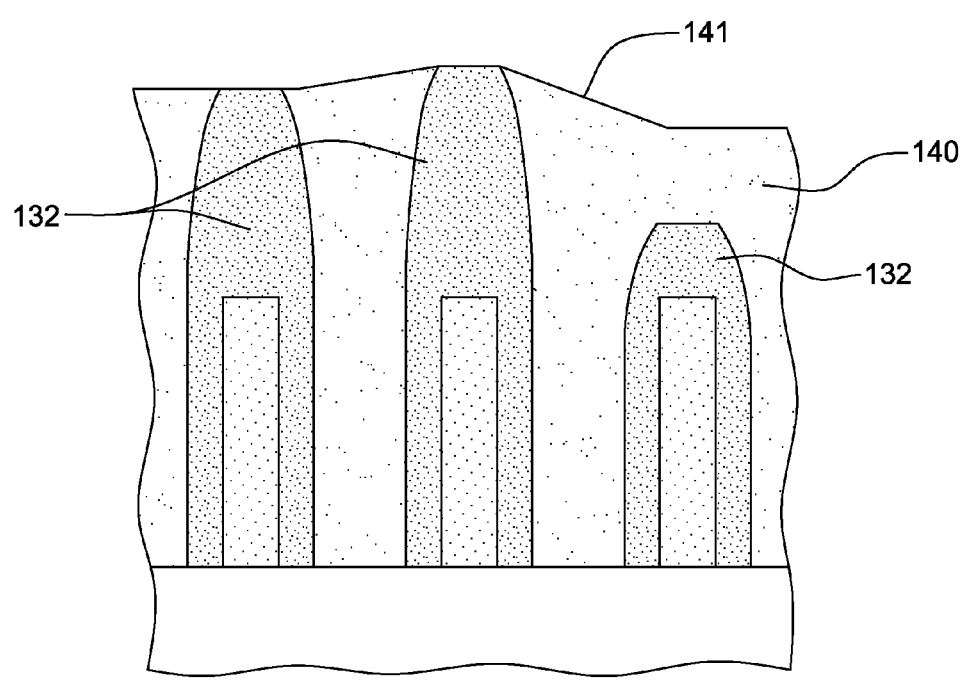

FIG. 1B depicts the intermediate structure after, for instance, a chemical-mechanical polishing (CMP) of the first dielectric material 140, stopping on hard mask 132, which means (in this example) stopping on hard mask 132 over the middle sacrificial gate electrode 120 illustrated, since this mask has the greatest height. The result is a non-planar exposed surface 141, which comprises part hard mask 132, and part first dielectric material 140. As noted, in one example, the hard mask is a silicon nitride, and the chemical-mechanical polishing (CMP) may proceed using (by way of example) a DA-nano slurry, available from DuPont® Air Products Nanomaterials, LLC, of Phoenix, Ariz., U.S.A.

Figure 1C:
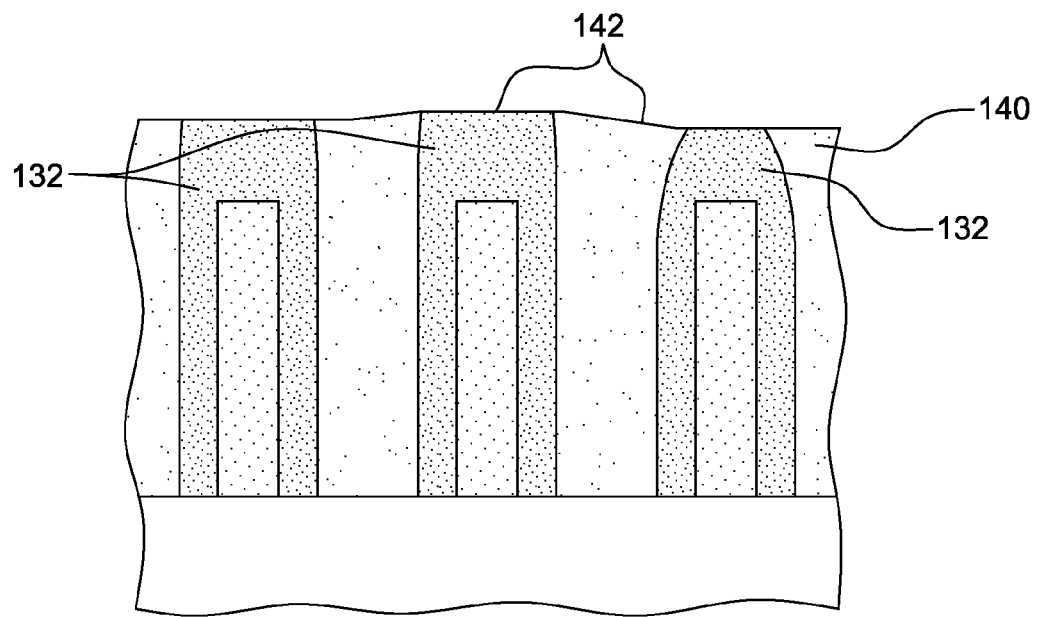

As illustrated in FIG. 1C, to reduce the hard mask 132 variations, and thus provide a more coplanar upper surface 142, a non-selective chemical-mechanical polish or non-selective etching may be employed. As understood, non-selective in this context means that the polish rate or etch rate is close between the hard mask 132 and first dielectric material 140, which in one example, are a nitride and oxide, respectively. Using such processing, the variations in the hard mask height across the intermediate structure may be reduced to more in the range of 15 nanometers, using today's technology. This 15 nanometer difference, however, still presents challenges to manufacturing using conventional RMG processing, particularly as technology nodes decrease.

Figure 1D:
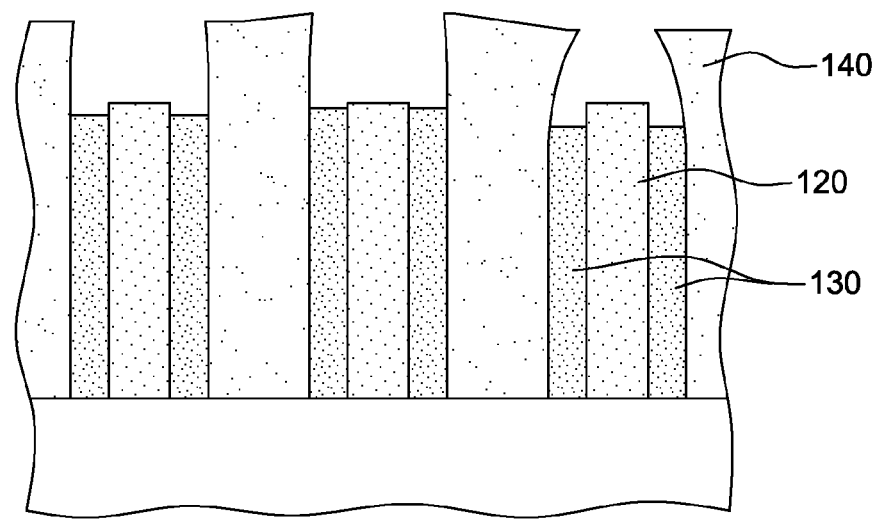

In FIG. 1D, the hard mask variation is translated to a divot variation in the sidewall spacers 130 after a selective hard mask etch-back. Assuming that the hard mask is a silicon nitride mask, then a dry etch (for instance, a nitrogen trifluoride etch), or wet etch (for example, a hot phosphorous etch) over the sacrificial gate electrodes could be employed to selectively etch-back the nitride.

Figure 1E:
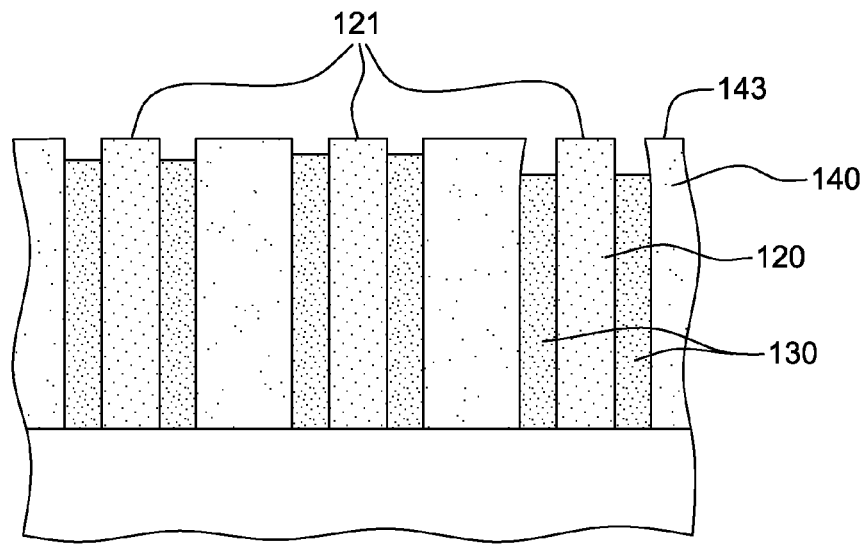

As illustrated in FIG. 1E, first dielectric material 140 is polished back using a chemical-mechanical polish with a hard stop on the sacrificial gate electrode 120, for example, hard stopping on the sacrificial a-Si or polysilicon. The result is that the upper, exposed surfaces 121 of sacrificial gate electrodes and the upper, exposed surfaces 143 of first dielectric material 140, are substantially coplanar. However, the sidewall spacers 130 remain recessed at different heights due to the different heights of the previously removed hard masks. By way of specific example, assuming that the first dielectric material is a field oxide, then a DA nano-slurry may be employed to perform a CMP polish back of the oxide with a stop on the sacrificial (e.g., polysilicon) gates.

Figure 1F:
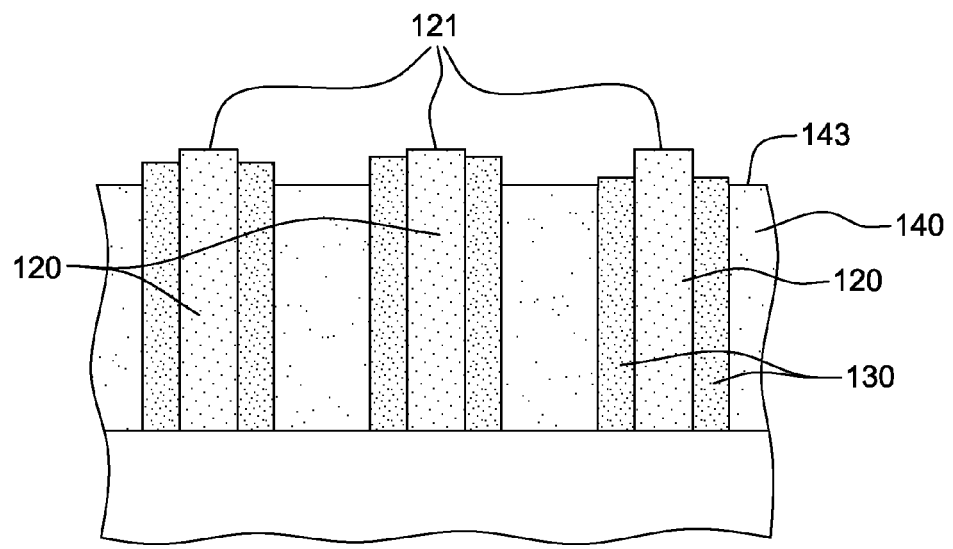

In the intermediate structure of FIG. 1F, the exposed, upper surfaces 143 of the first dielectric material 140 have been etched back somewhat, for example, 10-15 nanometers below the upper, exposed surfaces 121 of the sacrificial gate electrodes 120. This dielectric material etch back, which may either be a dry etch or, for example, a wet DHF etch, is employed in order to create a desired topography, as explained further below.

Figure 1G:
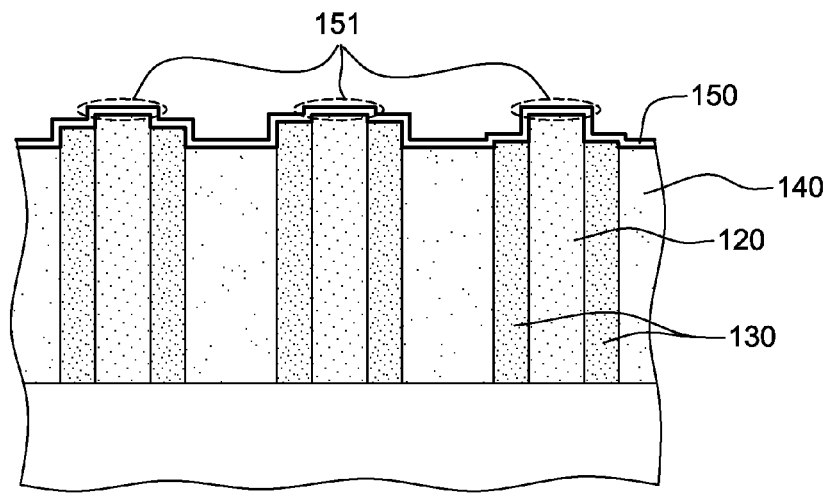

Next, as illustrated in FIG. 1G, a protective film 150 is conformally deposited (e.g., using atomic layer deposition) over the sacrificial gate electrodes 120, the sidewall spacers 130, and the first dielectric material 140, in accordance with one or more aspects of the present invention. Note that there is no variation in height between the protective film portions 151 over the sacrificial gate electrodes 120 since the previously exposed upper surfaces of the sacrificial gate electrodes are coplanar. By way of example, the protective film may be, for instance, a silicon nitride film or liner having a thickness less than or equal to 10 nanometers, for instance, in the range of 2-10 nanometers. Other materials, such as $Hf_2O$, $Al_2O_3$, $SiCN_2$, $SiCBN_2$, etc., may alternatively be employed. Note that, at different times, the protective film 150 may function as an etch stop, as well as a protective film over the first dielectric material, for example, during the high-k, pre-clean processing described below.

Figure 1H:
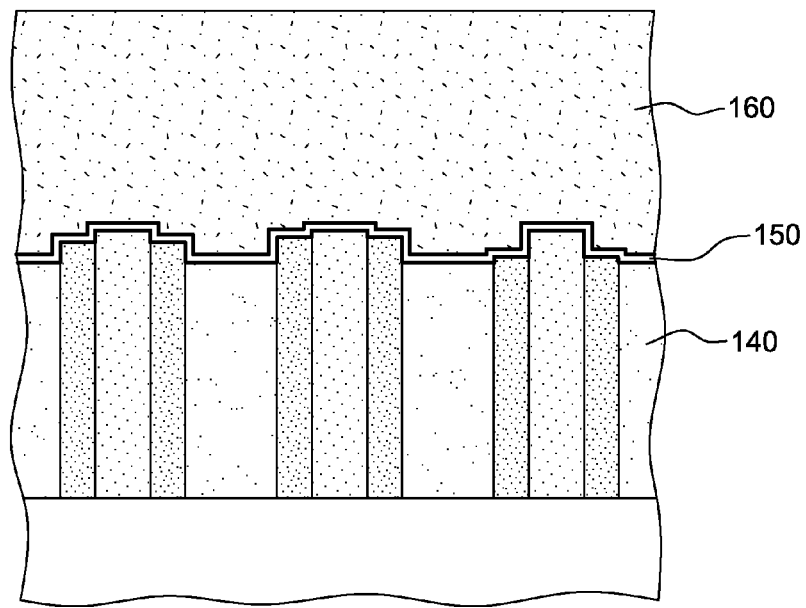

In FIG. 1H, a second dielectric material 160 has been deposited over protective film 150. This second dielectric material will typically be a different dielectric material than first dielectric material 140. In particular, a better quality oxide may be employed as the second dielectric material, since the gap field is less challenging at this process step; that is, since there are very shallow gaps, almost any oxide may be employed as the second dielectric material.

Figure 1I:
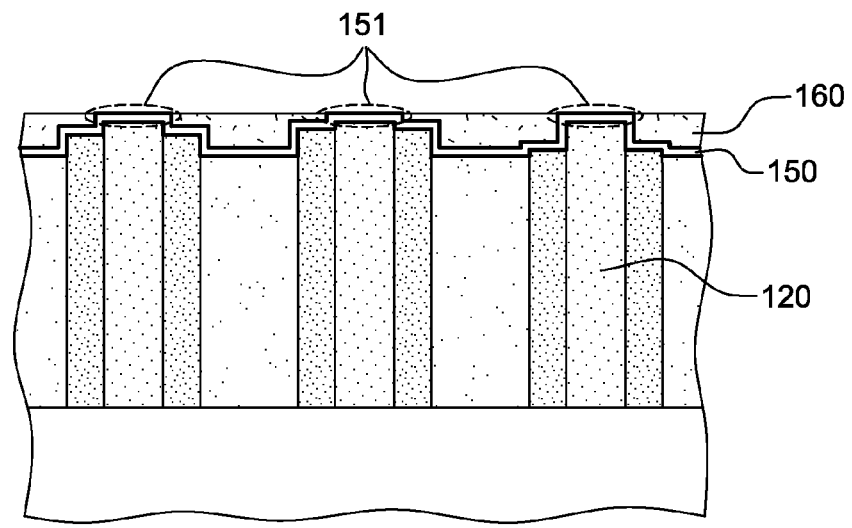

An additional chemical-mechanical polish may then be performed, stopping on protective film 150, and exposing protective film portions 151 over the sacrificial gate electrodes 120, as illustrated in FIG. 1I. The resultant uniformity is very good since there is substantially no variation in the protective film portions over the sacrificial gate electrodes.

Figure 1J:
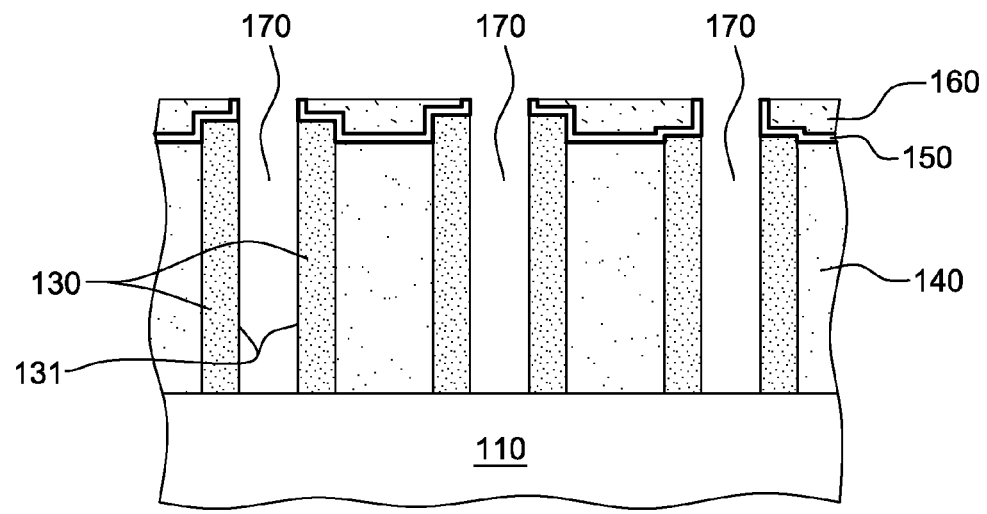
Figure 1K:
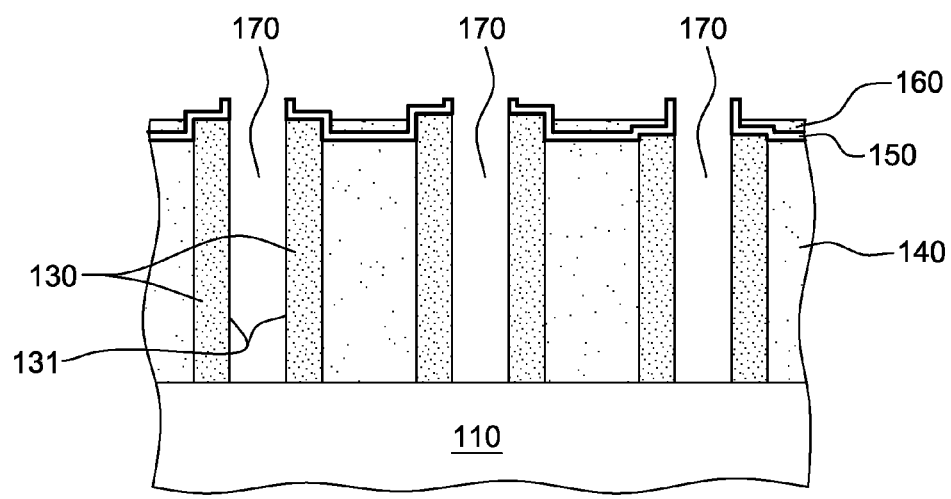

As illustrated in FIG. 1J, gate openings 170 are provided by, for instance, performing a dry-etch breakthrough of protective film portions 151 (see FIG. 1I), and performing removal of the sacrificial gate electrodes. Note with respect to FIG. 1J that the gate height openings are straight and coplanar at the upper surface of the intermediate structure, that is, there is no variation in the height of the gate openings. A high-k pre-clean process, such as a DHF process, may then be employed to clean, for instance, the oxide over the active layer 110. During this process, the second dielectric material 160 and the protective film 150 protect the underlying first dielectric material 140. Although there might be slight second dielectric material 160 loss, such as illustrated in FIG. 1K, the underlying first dielectric material between the replacement gate openings is protected.

Figure 1L:
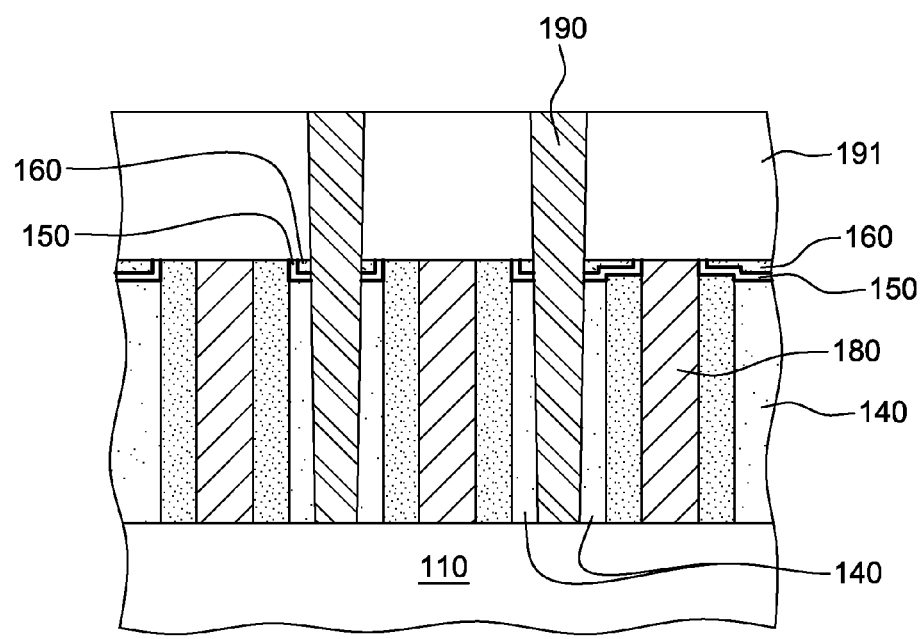

After high-k pre-clean, gate stacks 180 may be deposited within the gate openings 170 (FIG. 1K), and a gate stack CMP performed. Next, a third dielectric material 191 may be deposited, and openings formed to facilitate defining conductive connections 190 through first dielectric material 140 to the desired areas of the active region 110. Note that, in this embodiment, the conductive contacts 190 extend through second dielectric material 160 and protective film 150, such as illustrated in FIG. 1L. By way of example, the replacement gates 180 may comprise titanium nitride, tantalum nitride, tungsten, aluminum, copper, etc., and the conductive connections 190 may be any conductive material including, for example, silicide, tungsten, etc. Note that the contact 190 could also be a self-aligned contact with an additional dielectric cap formed on a top portion of gate 180.

Those skilled in the art will note that, advantageously, the methods and resultant semiconductor devices disclosed herein enhance replacement gate processing by producing replacement gates of more uniform height, while also protecting the ILD material during, for instance, high-k precleaning of the gate openings prior to formation of the gate stacks. In one embodiment, the protective film may be 2-10 nanometers in thickness, and the second dielectric material deposited over the protective film may be of higher quality, for example, in terms of etch rate, or other characteristics, than the underlying first dielectric material (that is, the ILD material).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
providing a plurality of sacrificial gate electrodes with sidewall spacers, the sacrificial gate electrodes with sidewall spacers being separated by, at least in part, a first dielectric material, wherein the sidewall spacers and the first dielectric material are recessed below upper surfaces of the sacrificial gate electrodes, and the upper surfaces of the sacrificial gate electrodes are exposed and coplanar;
depositing a protective film over the sacrificial gate electrodes, the sidewall spacers, and the first dielectric material;
providing a second dielectric material over the protective film, and planarizing the second dielectric material, stopping on and exposing the protective film over the sacrificial gate electrodes; and
opening the protective film over the sacrificial gate electrodes to facilitate performing a replacement gate process.

2. The method of claim 1, wherein the protective film comprises a material different from the first dielectric material.

3. The method of claim 1, wherein the protective film comprises one of SiN, $SiCN_2$, $Al_2O_3$, $SiCBN_2$, or $Hf_2O$.

4. The method of claim 1, wherein the protective film has a thickness of 5 nanometers or less.

5. The method of claim 1, wherein the planarizing of the second dielectric material further comprises planarizing an exposed surface of the second dielectric material to be substantially coplanar with a surface of the exposed protective film over the sacrificial gate electrodes.

6. The method of claim 1, wherein the providing of the plurality of sacrificial gate electrodes comprises planarizing the first dielectric material to be coplanar with the upper surfaces of the sacrificial gate electrodes, and afterwards, recessing the first dielectric material below the upper surfaces of the sacrificial gate electrodes.

7. The method of claim 1, wherein the first dielectric material is recessed a height of 10-20 nanometers below the upper surfaces of the sacrificial gate electrodes.

8. The method of claim 1, further comprising removing the sacrificial gate electrodes through the openings in the protective film, leaving gate openings, and performing pre-cleaning of the gate openings, wherein at least one of the second dielectric material or the protective film over the first dielectric material protects the first dielectric material during the pre-cleaning of the gate openings.

9. The method of claim 8, further comprising forming a replacement gate in at least one gate opening of the gate openings.

10. The method of claim 1, wherein the providing of the plurality of sacrificial gate electrodes comprises providing the plurality of sacrificial gate electrodes over an active region of a semiconductor device, the active region comprising at least one of a planar-type active region or a fin-type active region.

11. The method of claim 10, further comprising forming at least one conductive connection to the active region through the first dielectric material and the protective film over the first dielectric material.

12. The method of claim 11, wherein the forming the at least one conductive connection to the active region comprises forming the at least one conductive connection to the active region through the first dielectric material, the protective film over the first dielectric material, and the second dielectric material over the protective film.

13. The method of claim 1, wherein the sacrificial gate electrodes comprise polysilicon, the sidewall spacers comprise silicon nitride, the first dielectric material comprises field oxide, and the protective film comprises one of SiN, $SiCN_2$, $Al_2O_3$, $SiCBN_2$, or $Hf_2O$.

14. A semiconductor device comprising:
at least one semiconductor layer comprising an active region of the semiconductor device;
multiple replacement gates disposed above the active region of the semiconductor device, the replacement gates comprising sidewall spacers, and being separated by a dielectric material;
a protective film disposed over the dielectric material and contacting adjacent sidewall spacers of the replacement gates, wherein upper surfaces of the replacement gates are coplanar, and the dielectric material is recessed below the coplanar upper surfaces of the replacement gates; and
wherein the dielectric material is a first dielectric material, and the semiconductor device further comprises a second dielectric material over the protective film over the first dielectric material the second dielectric material over the protective film over the first dielectric material being coplanar with the coplanar upper surfaces of the replacement gates.

15. The semiconductor device of claim 14, wherein the protective film comprises a material different from the first dielectric material, and wherein the protective film has a thickness of 10 nanometers or less.

16. The semiconductor device of claim 14, wherein the protective film comprises one of SiN, $SiCN_2$, $Al_2O_3$, $SiCBN_2$, or $Hf_2O$.

17. The semiconductor device of claim 16, wherein the sidewall spacers comprise silicon nitride, and the first dielectric material comprises field oxide.

18. The semiconductor device of claim 14, further comprising a conductive connection to the active region through the first dielectric material and the protective film over the first dielectric material.

* * * * *